United States Patent
Ozono et al.

(10) Patent No.: US 6,460,756 B2
(45) Date of Patent: Oct. 8, 2002

(54) METHOD OF APPLYING BONDING PASTE

(75) Inventors: Mitsuru Ozono; Seiichi Sato; Nobuyuki Suefuji, all of Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/904,548

(22) Filed: Jul. 16, 2001

(65) Prior Publication Data

US 2002/0014519 A1 Feb. 7, 2002

(30) Foreign Application Priority Data

Jul. 18, 2000 (JP) .......................... 2000-216944

(51) Int. Cl.⁷ .................... B23K 31/02; B05D 5/12
(52) U.S. Cl. ................. 228/248.1; 427/96; 156/356
(58) Field of Search ............... 228/248.1, 248.5, 228/33; 427/96; 156/356

(56) References Cited

U.S. PATENT DOCUMENTS 6,348,234 B1 * 2/2002 Ozono et al.
6,361,831 B1 * 3/2002 Sato et al.

FOREIGN PATENT DOCUMENTS

JP 02001135652 A * 5/2001
JP 2001144113 A * 5/2001

OTHER PUBLICATIONS

US 2002/0037372 A1 Sato et al. (Mar. 28, 2002).*
US 2002/0014519 A1 Ozono et al. (Feb. 7, 2002).*
US 2001/0027877 A1 Kuribayashi et al. (Oct. 11, 2001).*

* cited by examiner

Primary Examiner—Tom Dunn
Assistant Examiner—Kiley Stoner
(74) Attorney, Agent, or Firm—Wenderoth, Lind & Ponack, L.L.P.

(57) ABSTRACT

A method of applying a bonding paste efficiently and uniformly by discharging the bonding paste from an application nozzle is presented. For applying the paste along a drawing pattern including a cross shape pattern composed of crossing plural application lines, the nozzle moves from the center of the cross shape to an end point along one application line, turns to a reverse direction at the end point, and moves to an end point at opposite side of the application line. Then, the nozzle returns from the end point to the center of the cross shape. The nozzle repeats this unit application line drawing operation for each application line. As a result, the nozzle stops less frequently near the center, has a shortened cycle time, and applies the paste uniformly.

2 Claims, 4 Drawing Sheets

METHOD OF APPLYING BONDING PASTE

FIELD OF THE INVENTION

The present invention relates to a method of applying a bonding paste to a substrate.

BACKGROUND OF THE INVENTION

In a die bonding for bonding chips to a substrate such as a lead frame, a paste for bonding is applied on the substrate. A dispenser moves an application nozzle from which a paste is discharged, and applies the paste in an application area on the substrate. In this method, a moving route of the application nozzle from the application start point to the application terminating point in the application area is set. The area is determined according to the shape of the chip. The moving route is defined in various shapes depending on a pattern of the route. For example, the paste is applied in a rectangular area, for example, along a cross-shape where the application nozzle moves in an X-figure, or along an asterisk-shape where a plus (+)-figure is overlapped on the X-figure.

A conventional application method will be explained below with reference to FIG. 4.

FIG. 4 shows a conventional application track of the paste. Within an application area A, a drawing pattern has an asterisk-shape. The application nozzle starts applying the paste from the drawing center C toward the outside, and then moves radially while commuting between turning points T1, T2, T3, . . . set near the center C, and end points P1, P2, P3, . . . set respectively at ends of application lines. The nozzle moves along all application lines, and applies the paste along the specified asterisk shape.

However, moving the application nozzle along the complicated application pattern such as the asterisk shape by a single stroke has the following problems. Whenever moving back and forth between the drawing center and each end, the nozzle must once stop at the turning points T1, T2, T3, . . . set near the center in order to change the direction. Accordingly, the application nozzle must decelerate and accelerate very frequently, such that the cycle time of the entire application operation is extended and the application efficiency is lowered. Furthermore, an average speed near the drawing center is lower than that in other areas, and the nozzle accordingly stays near the center for a longer time. As a result, the paste is applied around the center more and thus is not applied uniformly.

SUMMARY OF THE INVENTION

An application method for applying a bonding paste according to the present invention has an enhanced application efficiency and applies the paste uniformly.

The method of applying a bonding paste on a substrate uses an application nozzle moving and discharging the paste along a drawing pattern having a cross shape where plural application lines cross. The method includes:

(a) a step of moving the application nozzle from the application start point set near the center of the cross shape to a first end point on a first application line of the plural application lines, (b) a step of moving the application nozzle from the first end point to a second end point of the first application line along the first application line, (c) a step of moving the application nozzle from the second end point to a first application terminating point set near the central position of the first application line along the first application line, (d) a step of moving the application nozzle from the first application terminating point to a third end point on a second application line of the plural application lines along the second application line, (e) a step of moving the application nozzle from the third end point to a fourth end point of the second application line along the second application line, and (f) a step of moving the application nozzle from the fourth end point to a second application terminating point set near the central position of the second application line along the second application line.

In this method, the application nozzle stops near the center less frequently, has a shortened cycle time, and applies the paste uniformly.

DESCRIPTION OF THE PREFERRED EMBODIMENT

Figure 1:
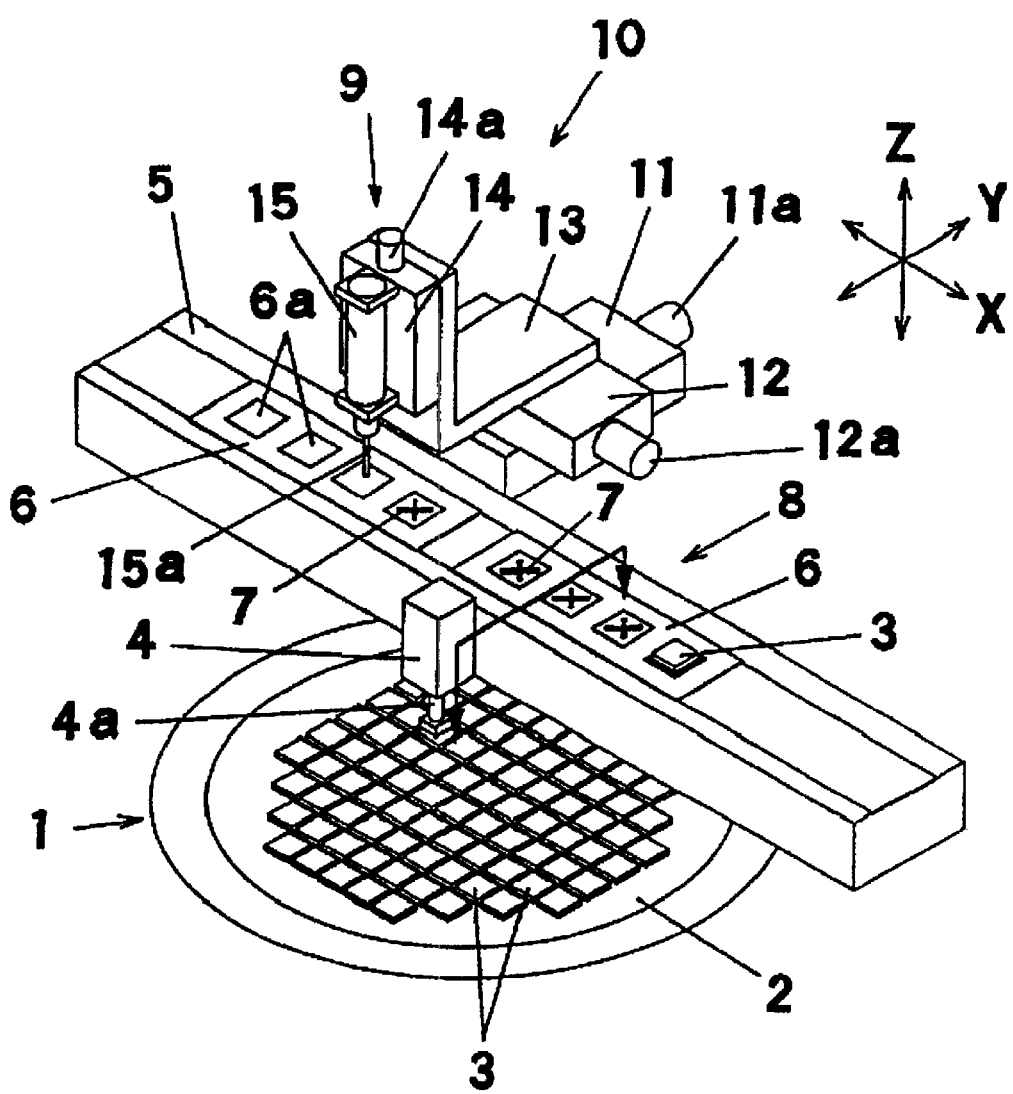
FIG. 1 is a perspective view of a die bonding apparatus in an exemplary embodiment of the present invention.
Figure 2:
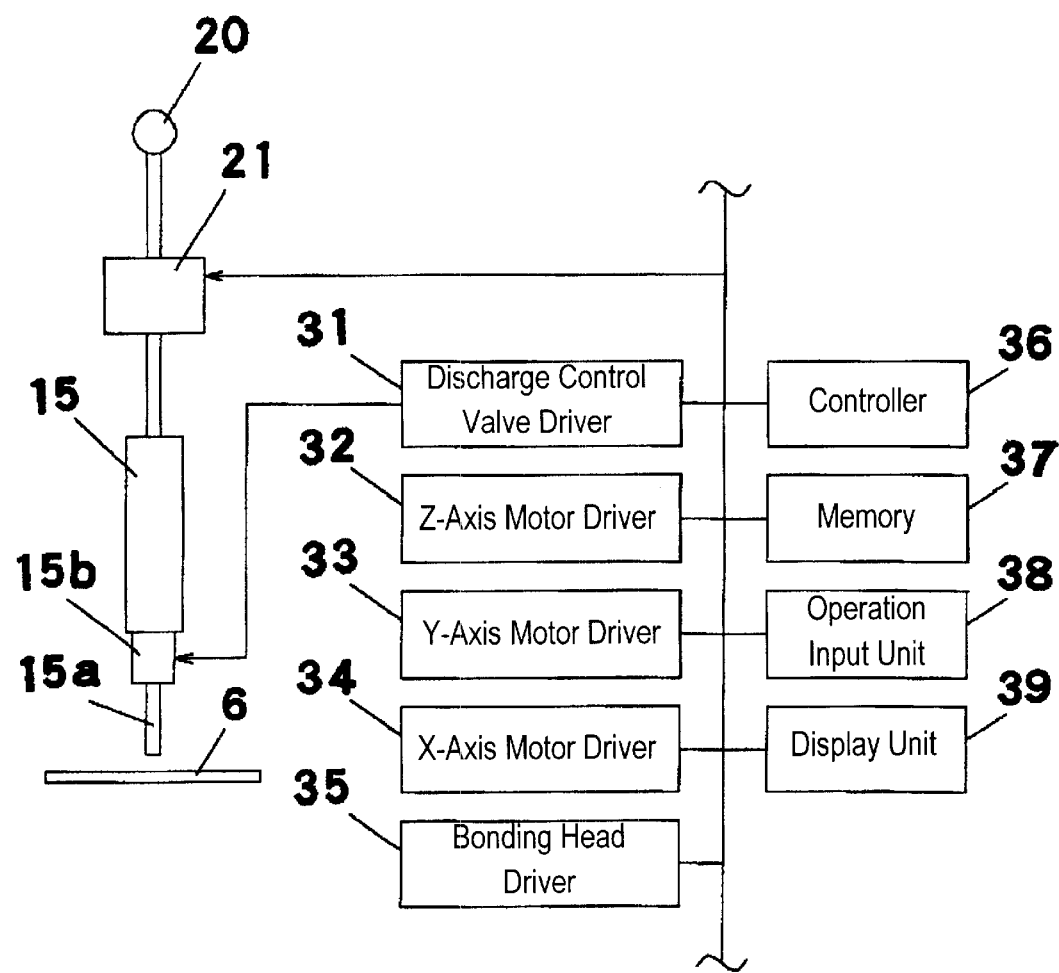
FIG. 2 is a block diagram of a control system of the die bonding apparatus in the embodiment.
Figure 3:
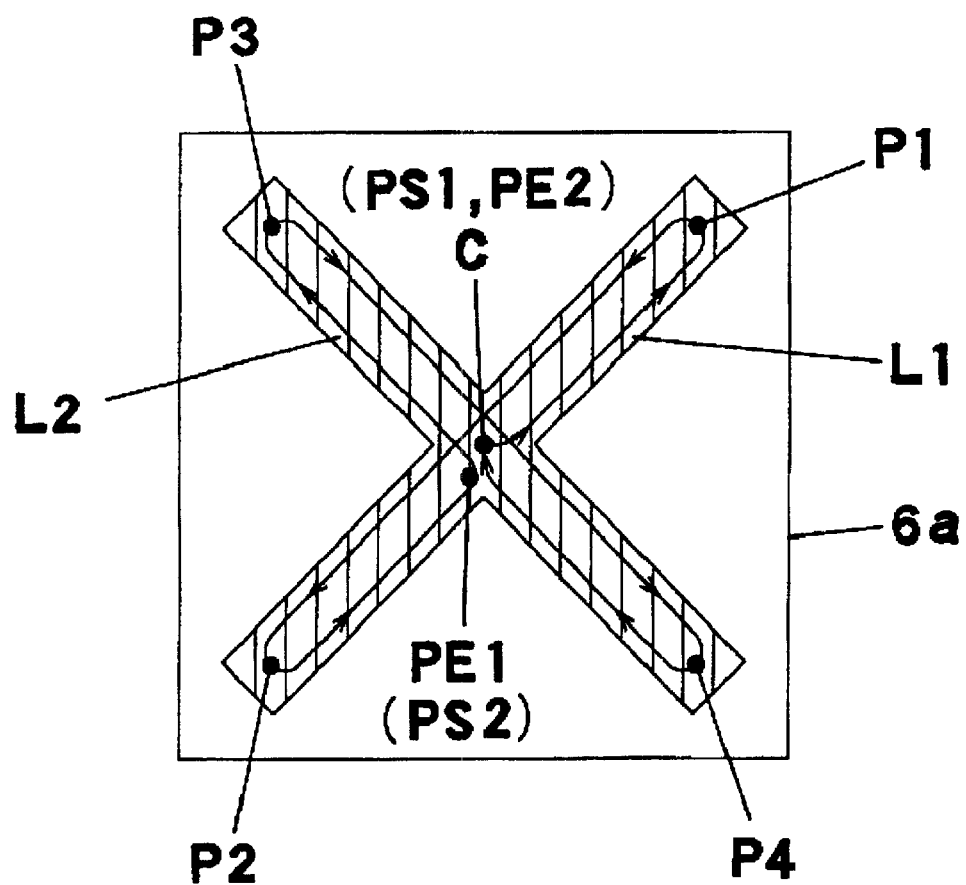
FIG. 3 shows a drawing pattern according to the embodiment.
Figure 4:
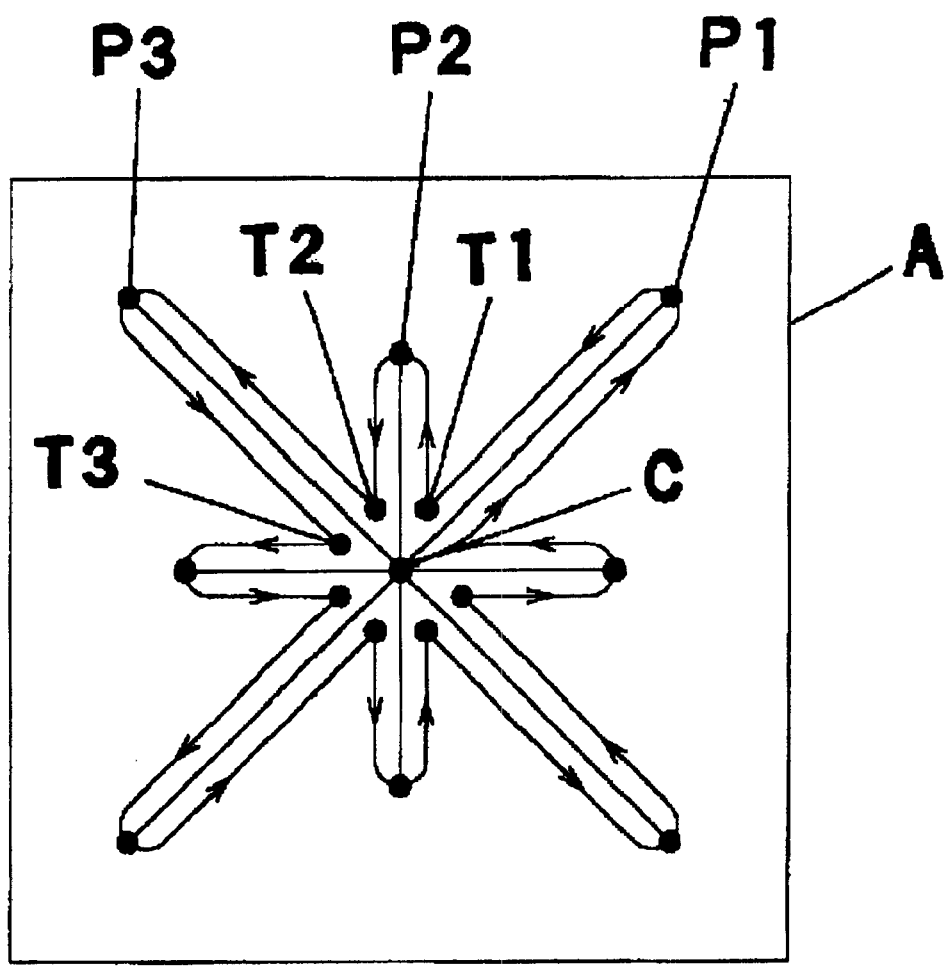
FIG. 4 shows a conventional application track of a paste.

FIG. 1 is a perspective view of a die bonding apparatus in an exemplary embodiment of the present invention. FIG. 2 is a block diagram of a control system of the die bonding apparatus. FIG. 3 shows a drawing pattern of the die bonding apparatus.

In FIG. 1, in a chip feeder 1, a wafer sheet 2 is held by a table (not shown). Multiple chips 3, i.e., semiconductor devices, are adhered on the wafer sheet 2. At the side of the chip feeder 1, a conveying route 5 is provided for conveying a lead frame 6. In the conveying route 5, the lead frame 6 is positioned at a paste application position and a bonding position. Above the chip feeder 1, a bonding head 4 is disposed, and the head 4 is moved in horizontal and vertical directions by a moving mechanism (not shown).

At the other side of the conveying route 5, a paste application unit 9 is disposed. The application unit 9 includes a moving table 10 and a paste dispenser. The dispenser including a syringe 15 having an application nozzle 15a is mounted to the table 10. The moving table 10 includes a Y-axis table 11, an X-axis table 12 stacked up on the table 11, and a Z-axis table 14 coupled on the X-axis table through an L-shaped bracket 13 to be disposed in the vertical direction. The Y-axis table 11, X-axis table 12, and Z-axis table 14 have a Y-axis motor 11a, an X-axis motor 12a, and a Z-axis motor 14a, respectively.

By driving the X-axis motor 12a, Y-axis motor 11a, and Z-axis motor 14a, the syringe 15 moves in the horizontal and vertical directions over the lead frame 6. The syringe 15 stores a paste 7 for adhering the chips 3 on the lead frame 6. The syringe 15, into which air pressure is introduced, has a valve 15b (see FIG. 2), which opens and closes the application nozzle 15a, and when opened, discharges the paste from an outlet of the application nozzle 15a.

The application nozzle 15a has its outlet positioned in the application area 6a, and moves while discharging the paste. As a result, the paste 7 is applied in an X-shaped application pattern in the application area 6a set on the lead frame 6 constituting an application object. The syringe 15, application nozzle 15a, and an air pressure applying unit for applying an air pressure to the syringe 15 compose a paste discharge section. The moving table 10 constitutes a moving section for moving the outlet of the application nozzle 15a.

Then, the lead frame 6 is sent to a bonding position 8 on the conveying route 5, and is positioned. On the paste 7 applied in the application area 6a, the chip 3 picked up from the chip feeder 1 is bonded by a nozzle 4a of the bonding head 4.

Referring to FIG. 2, the control system of the die bonding apparatus will be explained. In FIG. 2, air supplied from an air source 20 is fed into the syringe 15 through a regulator 21. The regulator 21, which is controlled by a controller 36, adjusts a pressure of the air fed into the syringe 15, and controls the discharge amount of the paste discharged from the application nozzle 15a. A discharge control valve driver 31 drives the valve 15b for opening and closing the application nozzle 15a. The discharge control valve driver 31 controlled by the controller 36 can have the application nozzle 15a start and stop discharging the paste. Instead of the controller 36 controlling the pressure in the regulator 21, the regulator 21 may be controlled by a manual operation to discharge a desired amount of paste.

An X-axis motor driver 34, a Y-axis motor driver 33, and a Z-axis motor driver 32 drive the X-axis motor 12a, Y-axis motor 11a, and Z-axis motor 14a of the moving table 10, respectively. The controller 36, as a control section, controls the X-axis motor driver 34, Y-axis motor driver 33, and Z-axis motor driver 32, and thus the moving table 10.

A memory 37 stores data about the application operation of the application nozzle 15a. The data includes the drawing pattern which includes the application starting point and application terminating point set in the application area, the nozzle passing point during the application operation, the moving speed of the application nozzle 15a, and discharge amount of paste. On the basis of the data stored in the memory 37, the controller 36 controls the movement of the application nozzle 15a driven by the moving table 10, and the discharge operation of the paste from the application nozzle 15a of the syringe 15 in order to have the paste applied in the application area 6a in a desired drawing pattern. A bonding head driver 35, which is controlled by the controller 36, drives the bonding head 4. An operation input unit 38 having an input device including a keyboard and a mouse is used to enter operation commands and numerical data. A display unit 39 is a monitor device for displaying an input guide screen and others.

An operation of the bonding apparatus having such configuration will be explained below. In FIG. 1, the lead frame 6 is conveyed on the conveying route 5, and is positioned beneath the paste application unit 9. Then, the moving table 10 is driven to position the application nozzle 15a of the syringe 15 above the application area 6a of the lead frame 6, and the paste is applied.

Referring to FIG. 3, an application pattern will be explained. In FIG. 3, the application area 6a indicated by a square frame illustrates the range to be coated with the paste prior to a mounting of the chip 3. Herein, cross-shaped application lines L1 and L2 are set as a drawing pattern. In the application area 6a, the paste is applied along the drawing pattern.

A point C, the center C of the application area 6a, is the application starting point and application terminating point in the drawing pattern. In the application area 6a, aside from the application starting point and application terminating point, passing points of the application nozzle 15a are also set, and data about the points is stored in the memory 37. The application nozzle 15a moves sequentially through the passing points, and applies the paste in the specified drawing pattern.

The application nozzle 15a moves to the central point C shown in FIG. 3, and is positioned at a proper height for applying the paste from a lower end of the application nozzle 15a. Maintaining this specified height, the application nozzle 15a starts discharging the paste 7, and moves along a specified route. Herein, the application nozzle 15a moves along application lines L1 and L2.

The paste begins to be applied along the application line L1. The application nozzle 15a moves from a first application start point PS1 set on the center C of application line L1 toward an end point P1 of the application line L1. At the end point P1, the application nozzle 15a turns to move in a reverse direction and moves to an end point P2 at the opposite side along application line L1. At the point P2, the application nozzle 15a turns to move in a reverse direction again, and reaches a first application terminating point PE1 set near the center of the application line L1. As set forth, the application operation for the application line L1, a unit application line drawing operation, terminates.

As shown in FIG. 3, a drawing track is usually set in two ways, going and returning, along a common application line. In this case, in order to avoid the same track being drawn plural times, the application nozzle 15a moves above a line having a line offset in a direction perpendicular to the moving direction.

Then, an application line L2 is drawn. The application nozzle 15a is positioned at the first application terminating point PE1 after drawing application line L1. The point PE1 coincides with a second application starting point PS2 of the application line L2. That is, after applying the paste along the application line L1, the application nozzle 15a immediately starts to apply the paste along the application line L2, and moves from the second application starting point PS2 toward an end point P3 of the application line L2. At the end point P3, the application nozzle 15a turns to move in a reverse direction and moves along the application line L2 to an end point P4 at the opposite side. There, the application nozzle 15a turns to move in a reverse direction again, and reaches a second application terminating point PE2 set near the center of the application line L2. Then, the application for application line L2 terminates, and thus a drawing of the drawing pattern terminates.

According to the embodiment, for applying the paste along a drawing pattern including a cross-shape composed of plural application lines crossing each other, the application nozzle moves from the application start point set near the center of the cross-shape outward to the first end point on the application line, and then moves from the first end point to the second end point at the opposite side. Further, the nozzle moves from the second end point to the application terminating point of the application line set near the center of the cross-shape, and thus finishes a unit application line drawing operation. The nozzle repeats the unit application line drawing operation for each application line.

According to the invention, since the application nozzle accelerates and decelerates fewer times than in the conventional method for each application line, the average moving speed of the nozzle is faster than the speed in the conventional method. Therefore, the application efficiency is enhanced. Further, as compared with the conventional method, since points of acceleration and deceleration of the application nozzle 15*a* are not concentrated around the center of the drawing pattern, the paste is not applied excessively in a limited area around the center. Hence, the paste is applied uniformly in the application area 6*a*.

What is claimed is:

1. A method of applying a bonding paste to a substrate using an application nozzle moving and discharging the bonding paste along a drawing pattern including a cross shape composed of plural application lines crossing each other, said method comprising the steps of:

(a) moving the application nozzle from an application starting point near a center of the cross shape to a first end point on a first application line of the application lines, (b) moving the application nozzle from the first end point to a second end point of the first application line along the first application line, (c) moving the application nozzle from the second end point to a first application terminating point near a center of the first application line along the first application line, (d) moving the application nozzle from the first application terminating point to a third end point on a second application line of the application lines along the second application line, (e) moving the application nozzle from the third end point to a fourth end point of the second application line along the second application line, and (f) moving the application nozzle from the fourth end point to a second application terminating point near a center of the second application line along the second application line.

2. The method of claim 1, further comprising moving the application nozzle along at least one additional application line of the application lines other than the first and second application lines by repeating said step (d), said step (e), and said step (f).

* * * * *